US008121737B2

(12) United States Patent
West et al.

(10) Patent No.: US 8,121,737 B2
(45) Date of Patent: Feb. 21, 2012

(54) SYSTEMS AND METHODS FOR PRESENTING SAVING OPPORTUNITIES FOR ELECTRONIC EDVICES

(75) Inventors: William B. West, Sandy, UT (US); Wallace Eric Smith, Pleasant Grove, UT (US); Paul E. Nagel, Draper, UT (US)

(73) Assignee: Control4 Corporation, Salt Lake City, UT (US)

( * ) Notice: Subject to any disclaimer, the term of this patent is extended or adjusted under 35 U.S.C. 154(b) by 248 days.

(21) Appl. No.: 12/498,932

(22) Filed: Jul. 7, 2009

(65) Prior Publication Data

US 2010/0004791 A1 Jan. 7, 2010

Related U.S. Application Data

(60) Provisional application No. 61/078,697, filed on Jul. 7, 2008.

(51) Int. Cl.

| | |
|---|---|
| ***G05D 3/12*** | (2006.01) |
| ***G05D 5/00*** | (2006.01) |
| ***G05D 9/00*** | (2006.01) |
| ***G05D 11/00*** | (2006.01) |
| ***G05D 17/00*** | (2006.01) |
| ***G01R 11/56*** | (2006.01) |
| ***G01R 21/133*** | (2006.01) |
| ***G06F 17/00*** | (2006.01) |

(52) U.S. Cl. ......................... 700/286; 700/291; 705/412

(58) Field of Classification Search .................. 700/286, 700/291, 297–298; 705/37, 412

See application file for complete search history.

(56) References Cited

U.S. PATENT DOCUMENTS

| | | | | |
|---|---|---|---|---|
| 6,775,595 | B1 * | 8/2004 | Yabutani et al. | 700/291 |
| 6,778,882 | B2 * | 8/2004 | Spool et al. | 700/295 |
| 6,904,385 | B1 * | 6/2005 | Budike, Jr. | 702/182 |
| 6,983,210 | B2 * | 1/2006 | Matsubayashi et al. | 702/60 |
| 7,127,330 | B2 * | 10/2006 | Spool et al. | 700/291 |
| 7,142,949 | B2 * | 11/2006 | Brewster et al. | 700/286 |
| 7,877,235 | B2 * | 1/2011 | McConnell et al. | 702/188 |
| 2003/0009401 | A1 * | 1/2003 | Ellis | 705/35 |
| 2003/0193405 | A1 * | 10/2003 | Hunt et al. | 340/870.02 |
| 2005/0094610 | A1 | 5/2005 | de Clerq et al. | |
| 2007/0239317 | A1 * | 10/2007 | Bogolea et al. | 700/276 |
| 2007/0244604 | A1 | 10/2007 | McNally | |
| 2008/0147465 | A1 | 6/2008 | Raines et al. | |
| 2008/0229226 | A1 * | 9/2008 | Rowbottom et al. | 715/771 |
| 2010/0076835 | A1 * | 3/2010 | Silverman | 705/14.33 |
| 2011/0251730 | A1 * | 10/2011 | Pitt | 700/291 |

OTHER PUBLICATIONS

International Preliminary Report on Patentability issued for International Patent Application No. PCT/US2009/049837on Jan. 11, 2011.

International Search Report issued for International Patent Application No. PCT/US2009/049837on Sep. 1, 2009.

* cited by examiner

*Primary Examiner* — Ronald Hartman, Jr.

(74) *Attorney, Agent, or Firm* — Austin Rapp & Hardman

(57) ABSTRACT

A method for presenting saving opportunities for electronic devices is disclosed. Experience based data learned from past power behavior of one or more devices is received. One or more power saving opportunities are generated based on the experience based data. Estimated cost savings is calculated. A notification message is presented to a user that describes the power saving opportunities and associated cost savings for the opportunities.

30 Claims, 7 Drawing Sheets

SYSTEMS AND METHODS FOR PRESENTING SAVING OPPORTUNITIES FOR ELECTRONIC EDVICES

RELATED APPLICATIONS

This application is related to and claims priority from U.S. Provisional Patent Application Ser. No. 61/078,697, filed Jul. 7, 2008, for "Systems and Methods for Presenting Cost-Saving Choices for Resource-Consuming Devices," with inventors William B. West, Wallace Eric Smith, and Paul E. Nagel.

TECHNICAL FIELD

The present invention relates generally to electronic devices and embedded systems. More specifically, the present invention relates to systems and methods for presenting saving opportunities for electronic devices.

BACKGROUND

In recent years, the price of electronic devices has decreased dramatically. In addition, the types of electronic components that can be purchased have continued to increase. For example, DVD players, large screen TVs, multi-carousel CD and DVD players, MP3 players, video game consoles, and similar consumer electronic items have become more widely available while continuing to drop in price.

The decreasing prices and increasing types of electronic components have packed today's homes and businesses with modern conveniences. Typical homes and businesses now include more power-consuming devices than ever before. As more of these components are sold, the average household power consumption also increases. As power demands increase, the cost of running these devices also increases. Furthermore, the ever-increasing cost of resources, such as electricity, may be a concern.

As utility costs increase, home owners and businesses may seek to decrease their consumption to limit this expense. However, consumers may not be aware of cost-effective techniques that may allow savings with minimal inconvenience. Accordingly, an improved system for providing users with options for decreasing the cost of resources consumed at a particular site is desirable.

DETAILED DESCRIPTION

Figure 1:
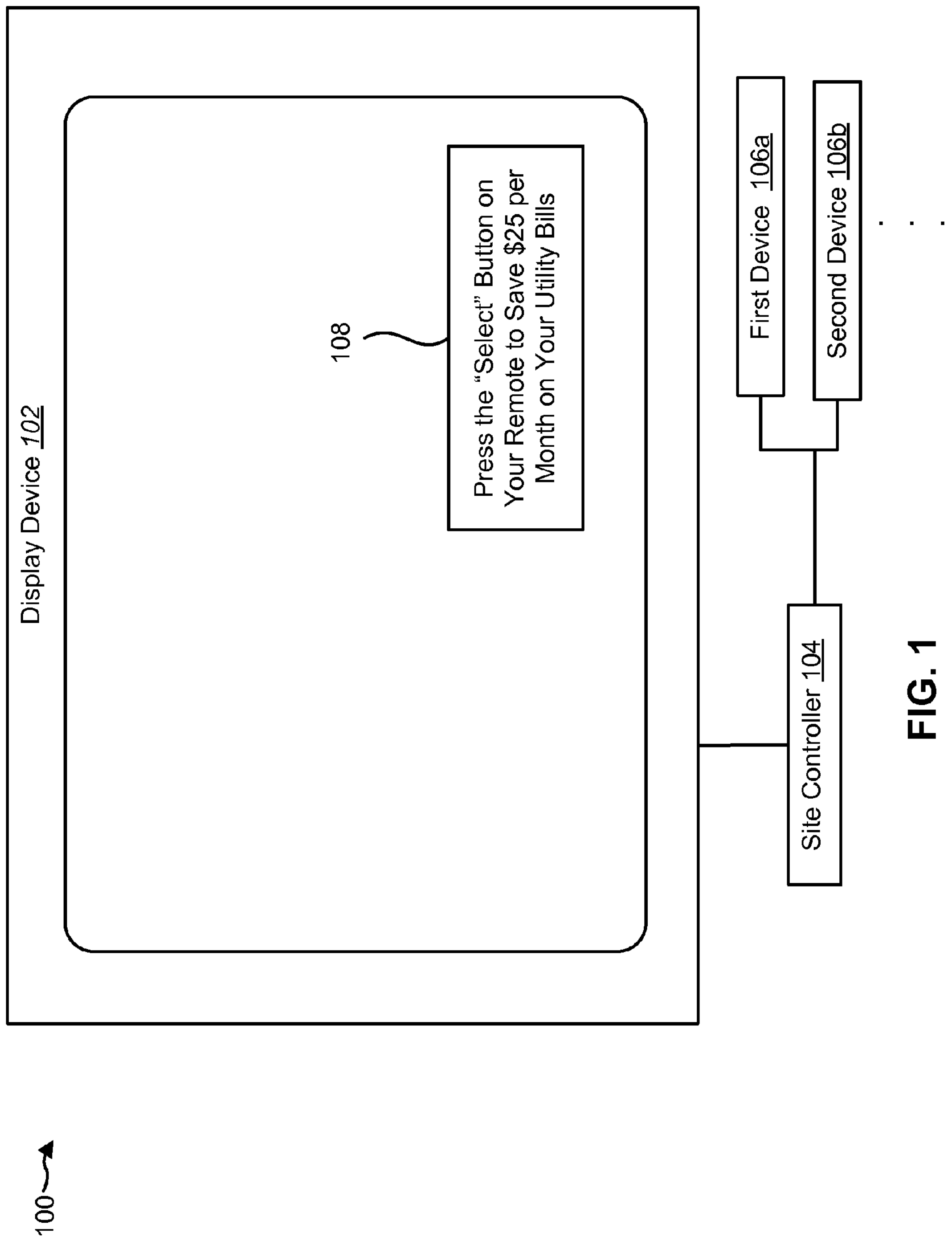
FIG. 1 is a block diagram illustrating one configuration of a site controller system.

A method for presenting saving opportunities for electronic devices is disclosed. Experience based data learned from past power behavior of one or more devices is received. One or more power saving opportunities are generated based on the experience based data. Estimated cost savings is calculated. A notification message is presented to a user that describes the power saving opportunities and associated cost savings for the opportunities.

In one configuration, one or more of the devices may be controlled based on an opportunity chosen by the user. Non-experience based data about present and future conditions that may affect power consumption or the cost of power consumption in the devices may be gathered. One or more power saving opportunities may be generated based on the experience based data and the non-experience based data. The experience based data may be power usage patterns, power consumption rates of the devices, and/or typical loads of the devices. The non-experience based data may be a present price of power, an anticipated price of power, present weather conditions, anticipated weather conditions, user preferences in the devices, and/or available stored power.

In one configuration, the devices may be lighting devices, temperature control devices, security system devices, intercom system devices, audio devices, video devices, landscape devices, and/or control devices. The video devices may be Digital Versatile Disc (DVD) players, digital video recorders, videocassette recorders (VCRs), cable boxes, satellite receivers, and/or game consoles. The opportunities may be a target electric bill for the devices. The cost savings may be in units of currency or greenhouse gas emissions.

A system that is configured to present saving opportunities for electronic devices is also disclosed. The system includes a processor and memory in electronic communication with the processor. Executable instructions are stored in the memory. The instructions are executable to receive experience based data learned from past power behavior of one or more devices. The instructions are also executable to generate one or more power saving opportunities based on the experience based data. The instructions are also executable to calculate estimated cost savings for the opportunities. The instructions are also executable to present a notification message to a user that describes the power saving opportunities and associated cost savings for the opportunities.

A computer-readable medium including executable instructions is also disclosed. The instructions are executable for receiving experience based data learned from past power behavior of one or more devices. The instructions are also executable for generating one or more power saving opportunities based on the experience based data. The instructions are also executable for calculating estimated cost savings for the opportunities. The instructions are also executable for presenting a notification message to a user that describes the power saving opportunities and associated cost savings for the opportunities.

The terms "power" and "energy" may be used interchangeably herein. It is to be understood that "power" generally refers to a rate of consumption and anything measured in watts, while "energy" generally refers to a unit of work measured in kWh and similar units of energy. However, the term "power" may be used herein to refer to both. Therefore the term "power" as used herein may refer to a rate of transfer, use, or generation of electrical energy as well as electrical energy itself.

FIG. 1 is a block diagram illustrating one configuration of a site controller system 100. The site controller system 100 may include a display device 102 (such as a television or computer monitor), a site controller 104, and one or more controlled devices 106, i.e., a first device 106*a*, a second device 106*b*, etc. For example, the site controller system 100 may be a home area network (HAN) that allows a user or users to monitor and/or manage power consumption of one or more devices 106 at a particular location, e.g., a home or office.

The site controller 104 may communicate with the controlled devices 106 and the display device 102. The site controller 104 may send control signals to alter the state of or otherwise control the devices 106. The site controller 104 may also receive data from the controlled devices 106 and send signals to the display device 102 for visual display. The site controller system 100 may include a single device 106 or multiple devices 106. A single site controller 104 may control the devices 106 at discrete geographic locations, such as multiple homes or office buildings owned or maintained by a single entity. For example, the site controller 104 may be a HAN controller connected to a display device 102 that allows a user to monitor power consumption and adjust preferences and settings in the electronic devices 106 throughout a home or business location. In this way, the site controller system 100 may allow the user to customize a power-saving profile with minimal inconvenience.

The controlled devices 106 may include resource-consuming devices 106, such as a temperature control system (i.e., a heating and/or cooling system), a lighting system, an audio/video device, a sprinkler system, etc. While the various configurations may be described using electronic devices 106, the devices 106 may consume any type or combination of resources, e.g., electricity, natural gas, heating oil, water, etc. In other words, the present systems and methods are equally applicable to presenting saving opportunities for devices 106 that consume resources other than electricity.

In one configuration, the site controller 104 may receive experience based data from the devices 106. The experience based data, (i.e., heuristic data), may be any data that is learned, at least in part, from past power consumption behavior of the devices 106, e.g., usage patterns, consumption rates, etc. Additionally, the site controller 104 may gather non-experience based data about present and future conditions that may affect power consumption or the cost of power consumption, e.g., current or projected weather conditions, current or projected power prices, etc. This data may be gathered in a number of ways. For example, the experience based data may be gathered by the site controller 104 based on historical, actual power consumption of the devices 106 over a period of days, weeks, months, or years. Alternatively, the experience based data may be gathered, or formulated, based on the current control pattern set by the site controller 104 and known behavior of the devices 106. For example, the site controller 104 may use knowledge of past power consumption rates of the devices 106 and the current control pattern to determine experience based data. The non-experience based data may be gathered from a third party source, such as a utility company, the Internet, or from one of the local devices 106 itself, e.g., one of the devices may be a thermometer that measures and reports the current weather conditions. Therefore, in one configuration, the site controller system 100 may not communicate with non-local devices outside a particular geographic location, i.e., the site controller 104 may use only data gathered from the local devices 106 within a home or business location to formulate power saving opportunities. Specifically, the site controller 104 may only use data from a utility company and local devices 106, but not the Internet, to generate power saving opportunities.

After the site controller 104 receives the experience based data from the devices 106 and gathers non-experience based data, the site controller 104 may generate one or more power saving opportunities based at least on the experience based data. In other words, the site controller 104 may not gather and/or use any non-experience based data to generate the opportunities. As used herein, a "power saving opportunity" or "opportunity" refers to a combination of control profiles for one or more devices 106 that collectively results in a reduction in overall power consumption or the price of power consumption for a location. For example, the opportunity may reschedule various appliances to operate during times of less expensive power, e.g., operate a dishwasher at night rather than during the day when power is more expensive or set a cooling system ON earlier during a day to cool a house down ahead of peak power pricing. Alternatively, an opportunity may alter the actual operation for a particular appliance, e.g., move the cooling system set point one degree higher during summer months, dim the brightness of a light by 10%, etc.

Opportunities may be generated and presented to a user in terms of power savings, currency savings, or carbon footprint. For example, the controller 104 may be configured to generate an opportunity to reduce power consumption by 10% for the next day, week, or month. This may be the same as reducing power costs by 10%, but it may not if a utility provider uses variable pricing based on demand. Therefore, in one configuration, anticipated power pricing data may be obtained and used to determine potential cost savings. Alternatively, or in addition, the site controller 104 may generate opportunities to save a particular dollar amount for a given time period, e.g., save $25 for the upcoming month. Additionally, an opportunity may be a target power bill for a period of time, e.g., adjust all devices 106 to achieve a $150 power bill for the upcoming month. Additionally, an opportunity may be presented as the change in carbon footprint, i.e., the total set of greenhouse gas emissions caused directly and indirectly by the home or business location.

A notification message 108 may then be presented to a user indicating the opportunity and its associated cost savings. For example, the notification message 108 may be an overlay bug or icon that would alert the homeowner to the opportunity. In the configuration shown in FIG. 1, the notification message 108 may be displayed on the display device 102. The notification message 108, which is only exemplary, may instruct the user to press a "Select" button on the pertinent remote control to save $25 per month on the user's utility bills. Of course, the notification message 108 may be embodied in a number of different ways, such as an audio message or visual message. It should also be noted that user input may alter the proposed opportunity. Furthermore, many opportunities may be presented to a user at the same time, after which the user may select one of the presented opportunities. The notification message 108 may be presented automatically in response to a user using any power management feature within the controller 104, i.e., any time the user is viewing output of the controller 104 on the display device 102. Alternatively, the user may navigate to an opportunity viewing interface without having to wait for the notification message 108 to be automatically displayed.

Figure 2:
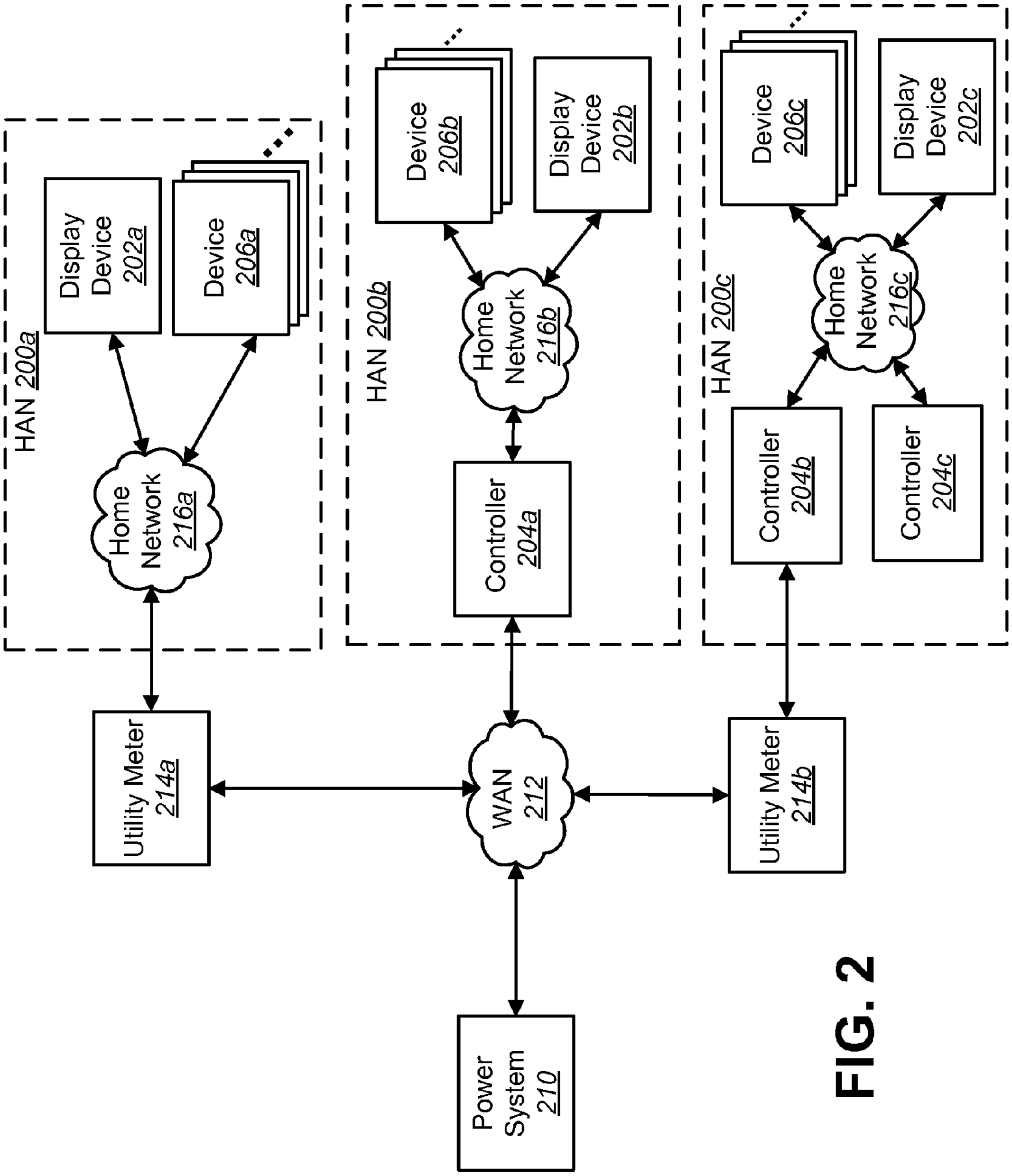
FIG. 2 is a block diagram illustrating various configurations of home area networks (HAN)

FIG. 2 is a block diagram illustrating various configurations of home area networks (HAN) 200. In other words, FIG. 2 illustrates three different configurations of the site controller system 100 described in FIG. 1 implemented as HANs 200. The HANs 200 may receive power from a power system 210. The power system 210 may communicate with one or more HANs 200 through a network 212, e.g., a wide area networks (WAN) 212. The power system 210 may be a facility, or part of a facility, that generates power for a geographic region using a variety of techniques. Additionally, the power system 210 may utilize one or more utility meters 214 when communicating with HANs 208. The utility meters 214 may be any device capable of measuring consumption of a utility, such as power, and communicating with a power system 210 or a controller 204. Additionally, the utility meter 214 may be capable of receiving and sending communications using various protocols, e.g., ZigBee Smart Energy (ZigBee SE), ZigBee Home Automation (ZigBee HA), Global System for Mobile communications (GSM), any of the HomePlug standards, Broadband over Power Lines (BPL), Power Line Communication (PLC), proprietary serial protocols, etc. Examples of utility meters 214 may include a power/electricity meter, a water meter, a gas meter, etc.

Many configurations of networks 212, 216 are possible. For example, the power system 210 may communicate with utility meters 214, and controllers 204 using WANs 212 with spread spectrum designed to cover a large geographic area. However, the communication between the utility meters 214 and the controllers 204 and home networks 216 may use infrared or serial technology designed for short-range, cost-effective communication. Many different configurations of networks 212, 216 may be possible, e.g. the WAN 212 may use 802.11 technology and the home networks 216 may use GSM technology. Any configuration capable of transmitting data between the various illustrated devices may be used.

Many configurations of HANs 200 are also possible. In a first configuration, the HAN 200*a* may not include a controller 204. Instead, the devices 206*a* in the HAN 200*a* may perform the function of a controller 204. In other words, the devices 206*a* itself may generate opportunities and send them to a display device 202*a* using the home network 216*a*. This may include gathering non-experience based data from the power system 210 via the first utility meter 214*a*. Once the opportunities have been received by the display device 202*a*, they may be displayed to a user and if an opportunity is selected by the user, the operation of the devices 206*a* may be adjusted based on the selected opportunity.

In contrast, a second HAN 200*b* configuration may include a controller 204*a*, but not a utility meter 214. The controller 204 may communicate, if necessary, with the power system 210 via the WAN 212 without a utility meter 214. In this configuration, the controller 204*a* may receive experience based data from the devices 206*b*, generate opportunities, and send the opportunities to the display device 202*b* using the home network 216*b*.

Furthermore, a third configuration of a HAN 200*c* may include a utility meter 214*b* and two controllers 204. For example, a first controller 204*b* may manage devices 206*c* on the first level of a home while a second controller 204*c* may manage devices 206*c* on the second level of a home. In this configuration, the controllers 204 may share the same home network 216*c* or use different home networks 216 to display opportunities on the display device 202*c*.

Figure 3:
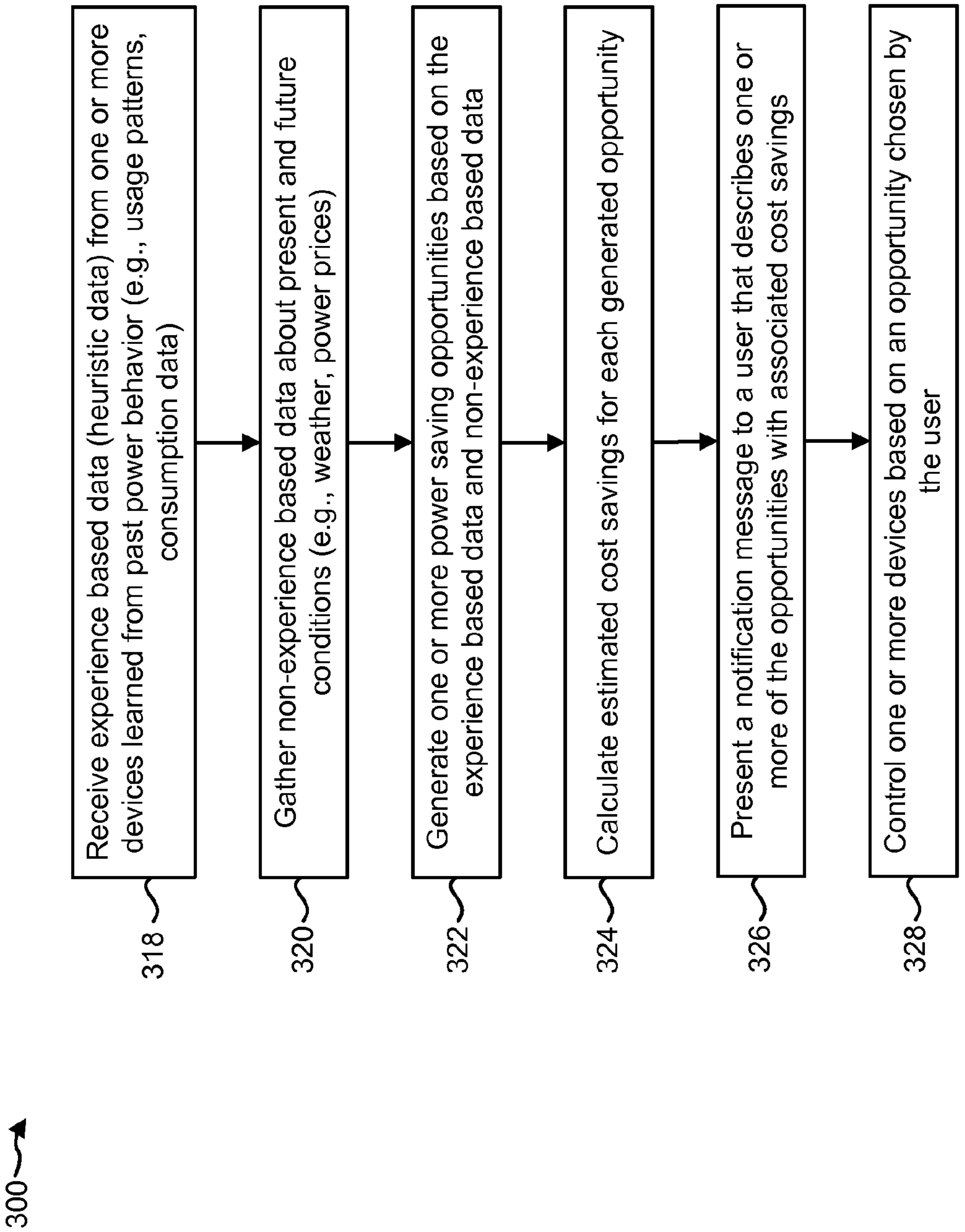
FIG. 3 is a flow diagram illustrating one configuration of a method for presenting saving opportunities for electronic devices.

FIG. 3 is a flow diagram illustrating one configuration of a method 300 for presenting saving opportunities for electronic devices 206. The method 300 may be implemented by a controller 204 designed to monitor and manage power consumption at a particular location. The controller 204 may receive 318 experience based data (heuristic data) from one or more devices 206 learned from past power consumption behavior, e.g., usage patterns, consumption data, etc. This experience based data may be received 318 from controlled electronic devices 206. The controller 204 may also gather 320 non-experience based data about present and future conditions that may affect power consumption and the price of power consumption at the site. The non-experience based data may be obtained directly from, for example, a utility company. In one configuration, the current pricing data may be used as an estimate of future pricing.

The controller 204 may generate 322 one or more power saving opportunities based on experience based data and non-experience based data. Alternatively, the opportunities may be generated 322 using only experience based data, i.e., data learned from past power consumption behavior. The opportunities may include lowering the HEAT setpoint by ten degrees during the early morning hours (when the building is unoccupied or its occupants are likely sleeping), or lowering the thermostat HEAT setpoint temperature by a single degree during the daytime hours. Alternatively, the experience based data may indicate that lights are frequently left on during working hours, when no one is present at a controlled home. In such a case, the opportunity may include automatically turning off all the lights at 9 a.m. to achieve a cost savings. Heuristic algorithms could be utilized to generate 322 the opportunities.

Another common example of an opportunity is to raise the thermostat COOL setpoint during the hot summer days, e.g., by 1, 2, 4, or 6 degrees. This may be used as a large electrical cost savings means. Another possible opportunity may be controlling white good appliances such as a dishwasher or dryer. These devices could be readied anytime, then asked to start their cycle when the cost of electrical power is low.

The control of swimming pools and hot tubs may also be altered by opportunities. These are large electricity consuming devices 206. By examining and using the weather forecast and pool temperature, the use of these devices 206 may be altered to save power.

The controller 204 may calculate 324 an estimated cost savings for each generated opportunity. The estimated cost savings may account for historical usage data (e.g., usage rates for an air conditioning system during the summer months), estimated consumption rates for specific devices 206, and the likely prospective price data. Consumption rates for specified devices 206 may be obtained in various ways, such as by monitoring changes in the resources consumed at the site when a specific device 206 is turned on or off, or from data provided by the device 206 manufacturers or other entities.

The controller 204 may present 326 a notification message 108 that describes one or more of the opportunities with associated cost savings. For example, the notification may be a pop-up window, icon, or overlay on the display device 202 or an audio message. User input (via, for example, a remote control or keyboard) may also be received with user-specified alterations to the opportunity in response to the notification message 108.

The controller 204 may then control 328 one or more of the devices 206 based on an opportunity chosen by the user. In one configuration, in response to user input, a control pattern set by the site controller 204 for the devices 206 is changed to conform with the opportunity. The opportunity may comprise an immediate change or may comprise a change to the usage pattern over a specific period of time (including a time period with no specified end time). The opportunity may also comprise reducing usage of one device 206 from the set of devices 206.

In one configuration, an opportunity may comprise a spending target for the user's utility bill. The controller 204 may use past behaviors/performance and adjust, or prompt the user to adjust, lighting control, heavy appliance use times and the thermostat to achieve this goal. The spending target or target bill may be for different periods of time, such as a month or a year, e.g., target bill of $150 for monthly power bill. The target bill may also be formulated based on user input, such as by completing a set of questions or a form, in addition to use of the likely prospective price data and the ascertained usage pattern.

Figure 4:
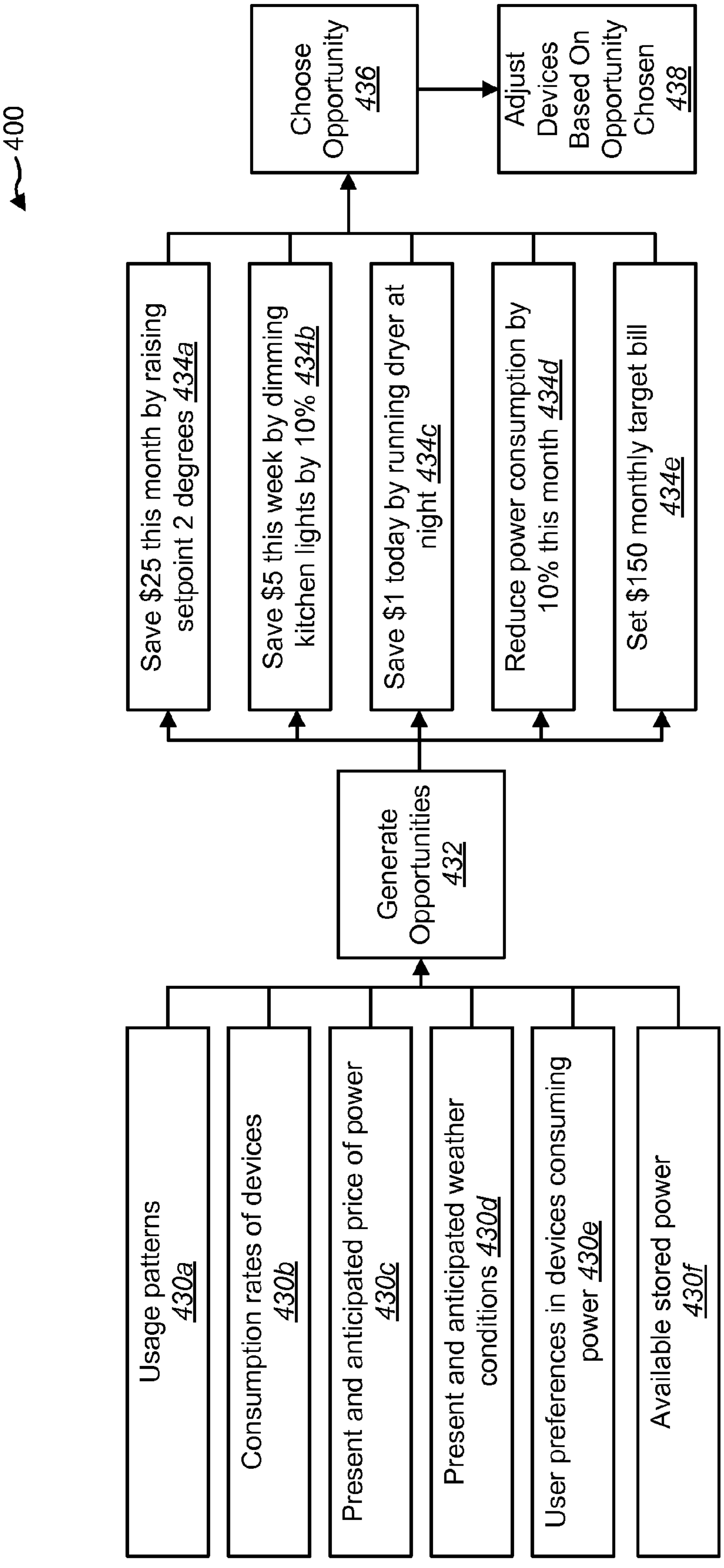
FIG. 4 is a flow diagram illustrating another method for presenting saving opportunities for electronic devices.

FIG. 4 is a flow diagram illustrating another method 400 for presenting saving opportunities for electronic devices 206. In the method 400, multiple opportunities 434 may be generated in a controller 204 and a user of the controller 204 may select from among them.

As before, the controller 204 may first receive data 430 about devices 206, the power grid, environmental conditions, etc. The data 430 may be experience based data learned from past behavior and, optionally, non-experience based data. For example, the experience based data may include usage patterns 430*a*, (e.g., data indicating device-specific and average power consumption as a function of time), and consumption rates of devices 430*b*. This experience based data may be received from the devices 206. The non-experience based data may include the present and anticipated price of power 430*c*, present and anticipated weather conditions 430*d*, user preferences in devices consuming power 430*e*, and available stored power 430*f*. It should be noted that many other factors may be used by the controller 204 to generate 432 opportunities 434. The opportunities 434 may include saving $25 this month by raising the set point of a cooling system by 2 degrees 434*a*, saving $5 this week by dimming kitchen lights by 10% 434*b*, saving $1 today by running dryer at night 434*c*, reducing power consumption by 10% over the following month 434*d*, setting a monthly target power bill of $150 434*e*, etc. Additionally, the controller 204 may present the user with an interface that allows the user to create their own opportunity 434. For example, a user may add or remove different power saving options, e.g., changing pool temperature, changing thermostat set point, placing home theater components in sleep mode. In response, the controller 204 may instantly estimate the savings (in power, currency, or carbon footprint) as a result of proposed behavior changes based on the data 430, and then the user may choose to implement the opportunity 434.

After the opportunities 434 have been presented to a user, the user may choose 436 an opportunity 434 and the controller 204 may adjust 438 the devices 206 based on the opportunity 434 chosen. Alternatively, the user may not choose any of the opportunities 434, in which case the controller 204 merely models the opportunities 434, but does not adjust 438 the devices 206.

Figure 5:
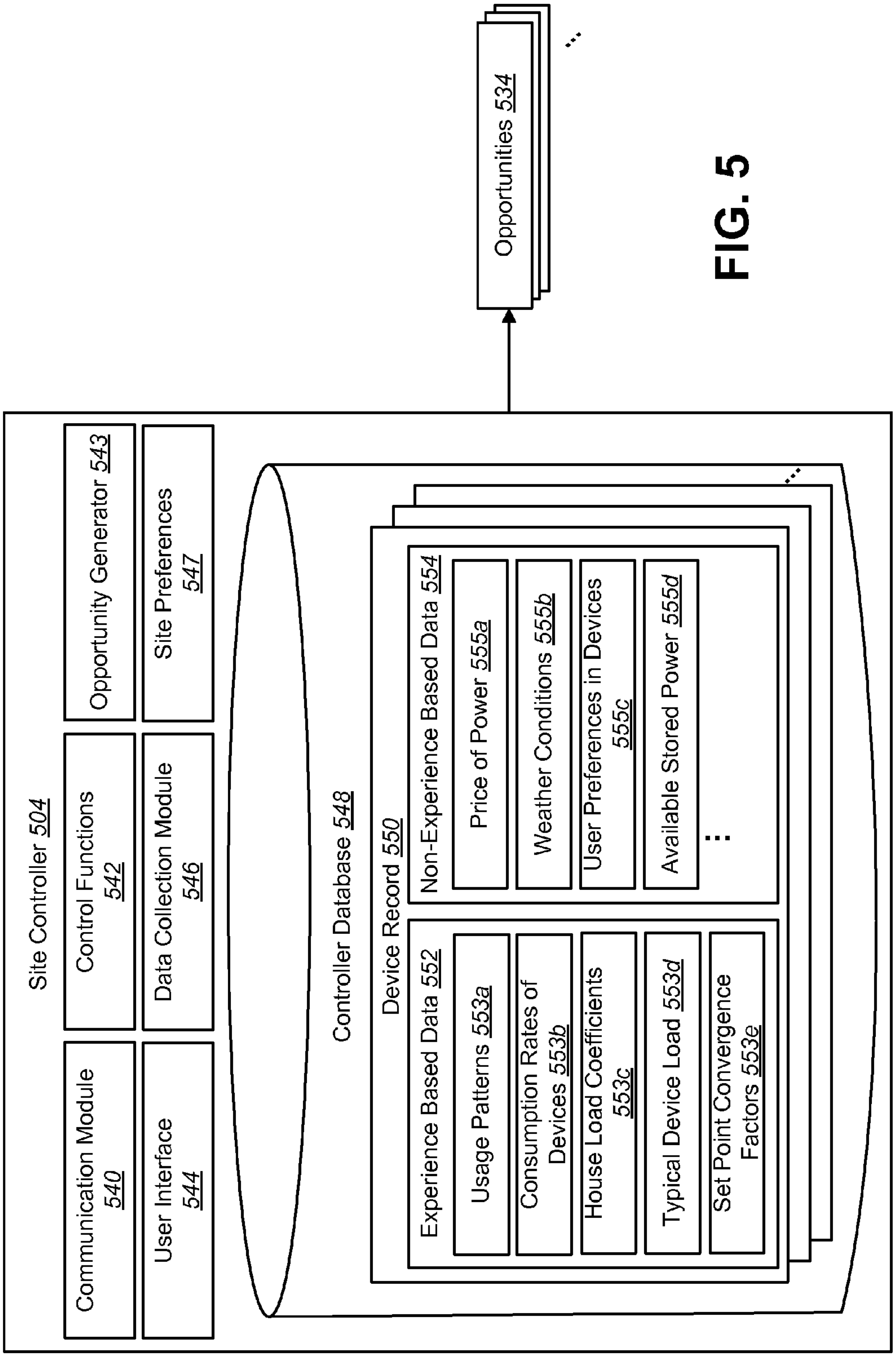
FIG. 5 is a block diagram illustrating a site controller.

FIG. 5 is a block diagram illustrating a site controller 504. The controller 504 may include a communication module 540 that may communicate with a power system 210, a utility meter 214, electronic devices 206, or some combination of the three. The controller 504 may communicate with other devices 206 using various methods including, but not limited to, an infrared (IR) connection, an Ethernet connection, a wireless connection using the 802.11g (WiFi) standard, a wireless connection using the 802.15.4 (ZigBee) standard, or other wired or wireless connections. Alternatively, there may be more than one controller 504 for a site or there may not be a controller 504 for a site, i.e., the device 206 itself may generate opportunities 534 and present them to a user.

The controller 504 may also include a user interface 544 that allows a user to interact with the controller 504. The user interface 544 may send data to a display device 202 in the form of charts, graphs, waveforms, etc. and may receive input from users in a variety of ways. For example, the user interface 544 may display a customizable power consumption report showing the consumption within a home or business location for a defined period of time, the cost associated with that power consumption, and opportunities 534 for reducing the cost in the future. The user interface 544 may also prompt the user for input, receive the user input, and adjust the control of the device(s) 206 based on the input, i.e., in accordance with a chosen opportunity 534.

The controller 504 may also include control functions 542 for one or more devices 206. Control functions 542 may include instructions that control the operation of devices 206. For example, a control function 542 may change the set point on a thermostat, change the setting on a light controller to ON, change the heat setting on a dryer, etc. It should be appreciated that these control functions 542 may not be the only means of controlling the devices 206 in the site. In other words, a user may also change the set point on a thermostat using the thermostat or turn the lights ON using the light controller in addition to using the controller 504.

The controller 504 may also include a data collection module 546 that collects data about each device 206 in the site, i.e., home or business location. In other words, the data collection module 546 may receive experience based data 552 learned from past power consumption behavior of the devices 206, e.g., usage patterns 553*a*, consumption rates of devices 553*b*, house load coefficients 553*c* (data relating to the base load of the home, e.g., the power consumption of the home independent of the device 206), typical device load 553*d*, set point convergence factors 553*e* for devices such as a heating and cooling system, etc. Optionally, the data collection module 546 may also collect non-experience based data 554 about present and future conditions that may affect power consumption or the cost of power consumption, e.g., present or anticipated price of power 555*a*, present or anticipated weather conditions 555*b*, user preferences in the devices 555*c*, available stored power 555*d*, etc. The experience based data 552 and optionally the non-experience based data 554 may be stored in device records 550 in the controller database 548 and used by the opportunity generator 543 to create saving opportunities 534. These opportunities 534 may be presented to the user in terms of currency, actual power savings, or carbon footprint savings.

The controller 504 may also include site preferences 547 that may be defined by a user of the site, e.g., home owner or building manager. These site preferences 547 may be groups of settings, or a profile, which affect the entire site or part of the site. For example, a user may have a vacation setting where the heating and cooling system is turned OFF, the lights are set to OFF, the pool temperature set point is lowered, etc. Likewise, there may be one or more conservation settings where the inside temperature set point is raised or lowered depending on the outside temperature, the lights are set to 80%, and the pool temperature set point is lowered. Likewise, there may be a night time setting where the inside temperature set point is raised or lowered depending on the outside temperature, the outside lights are set to OFF, and the pool temperature set point is lowered. These site preferences 547 may also specify general preferences as to power consumption and may be taken into account when generating the opportunities 534. For example, a user may specify that they are willing to pay for their needs at any cost, so the power consumption should not be reduced in any device unless a mandatory emergency reduction is needed. In this case, the opportunity generator 543 may not present any opportunities 534 to the user. Additionally, a user could specify that they were open to all opportunities 534, only opportunities 534 affecting the daytime hours, only opportunities 534 affecting devices 206 other than the heating and cooling system, only opportunities 534 during spring or autumn months, etc. In other words, the site preferences 547 may help the opportunity generator 543 to tailor generated opportunities 534 to the needs and preferences of the user.

Figure 6:
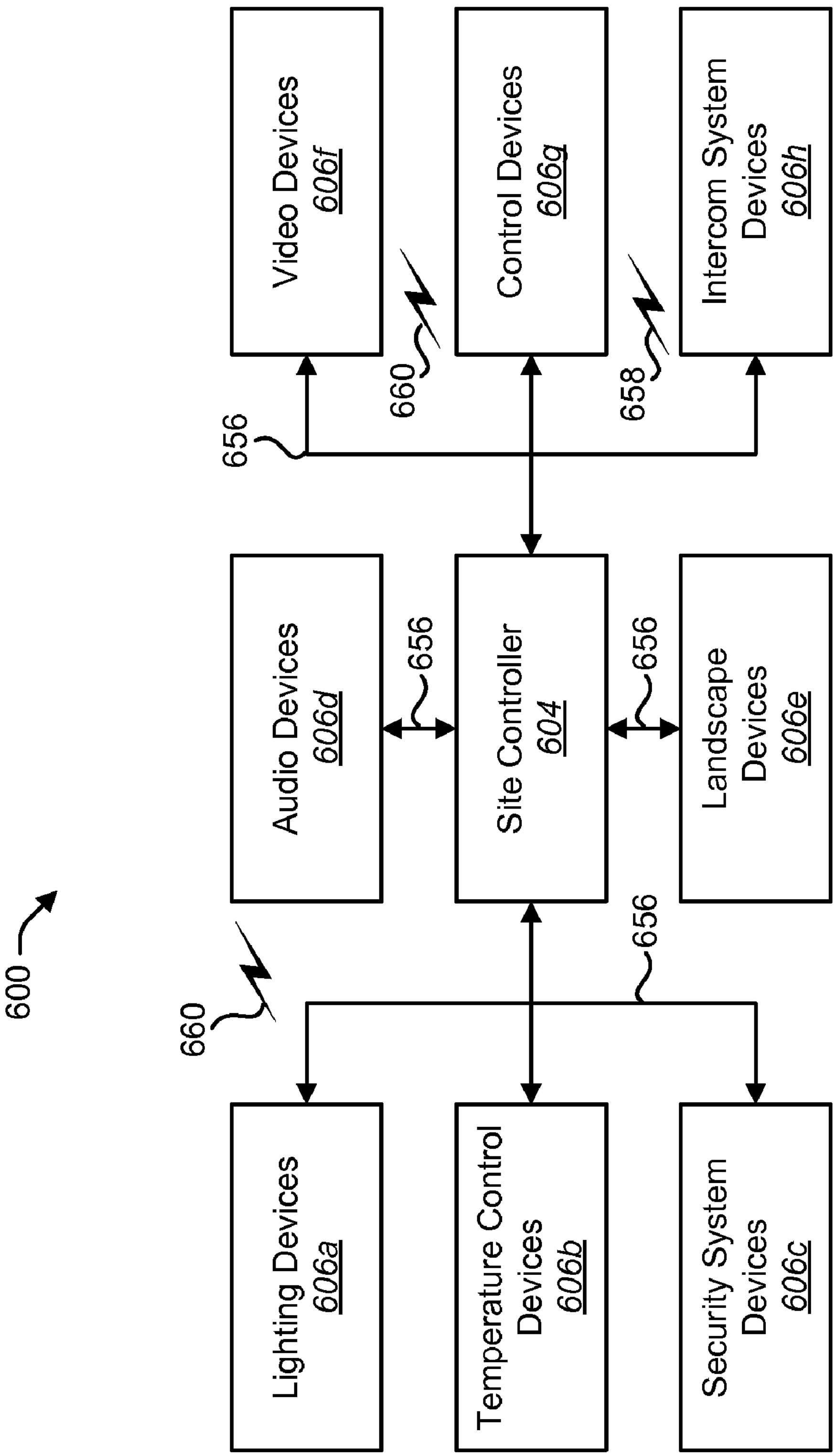
FIG. 6 is a block diagram illustrating one possible configuration of a site, e.g., a HAN in a home or business location.

FIG. 6 is a block diagram illustrating one possible configuration of a site 600, e.g., a HAN in a home or business location. The site 600 may include a site controller 604 and other devices 606. The controller 604 may be in electronic communication with the devices 606. The site 600 may include multiple controllers 604, but typically requires that one of the controllers 604 is designated as the primary controller 604.

The controller 604 may be connected to the devices 606 via wireless or wired connections. In the present configuration, the controller 604 may be connected to the devices 606 via an Ethernet connection 656, a WiFi connection 658, a ZigBee connection 660, or a combination of the three. The controller 604 may be capable of communicating via these network connections, i.e. Ethernet 656, WiFi 658, ZigBee 660, or other type of connections.

The devices 606, in the illustrated configuration, may include lighting devices 606*a*, temperature control devices 606*b*, security system devices 606*c*, audio devices 606*d*, landscape devices 606*e*, video devices 606*f*, control devices 606*g*, and intercom system devices 606*h*. Lighting devices 606*a* may include light switches, dimmers, window blinds, etc. Temperature control devices 606*b* may include thermostats, fans, fireplaces, and the like. Security system devices 606*c* may include security cameras, motion detectors, door sensors, window sensors, gates, or other security devices. Audio devices 606*d* may include AM/FM radio receivers, XM radio receivers, CD players, MP3 players, cassette tape players, and other devices capable of producing an audio signal. Landscape devices 606*e* may include sprinkler system devices, drip system devices, and other landscape related devices. Video devices 606*f* may include televisions, monitors, projectors, and other devices capable of producing a video signal. For example, the video devices 606*f* may be used to present the opportunities 534 to the user. The control devices 606*g* may include touch screens, keypads, remote controls, and/or other control devices 606*g* capable of communicating with and/or controlling another device 606. Intercom system devices 606*h* may include intercom microphones, intercom related video devices, and other devices typically associated with an intercom system.

Figure 7:
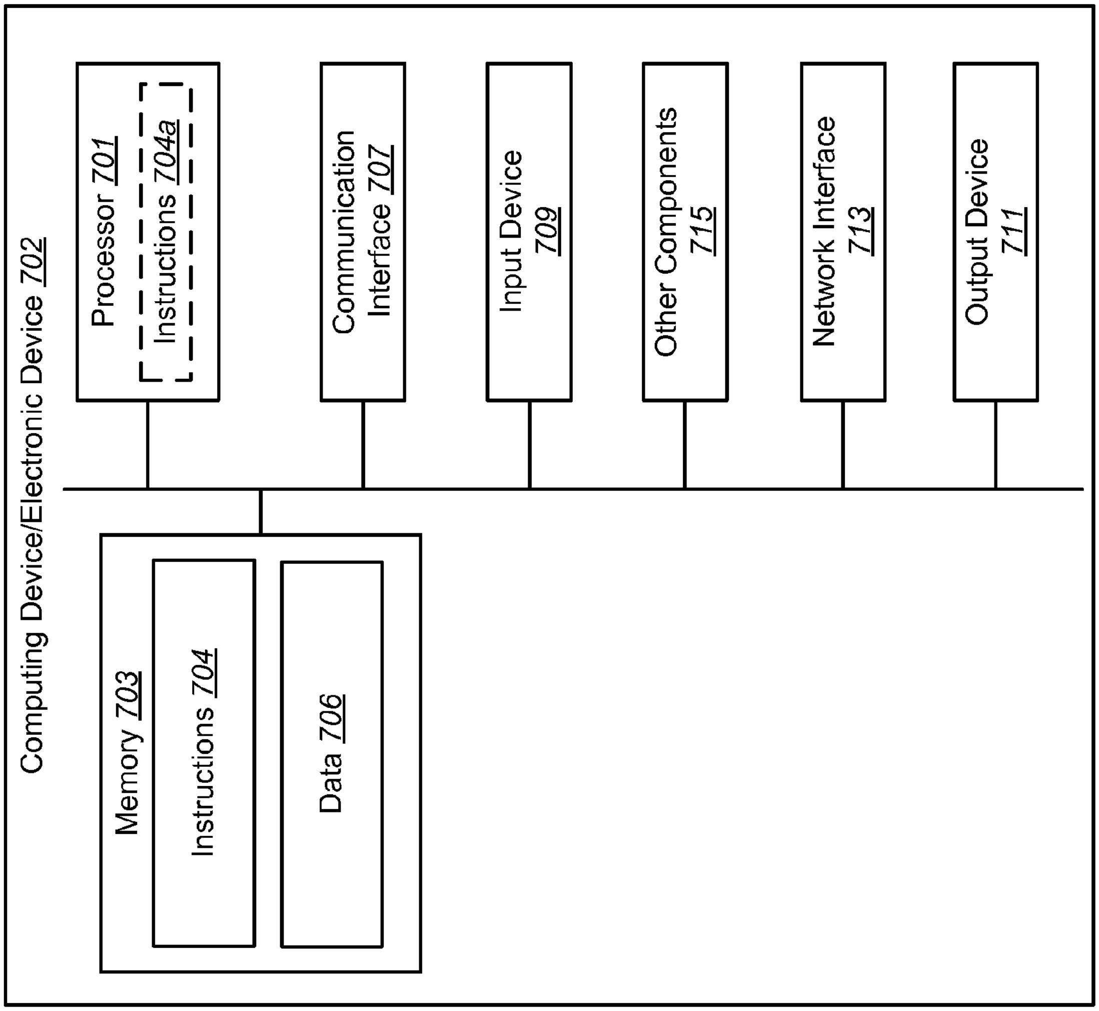
FIG. 7 is a block diagram illustrating various components that may be utilized in a computing device/electronic device.

FIG. 7 is a block diagram illustrating various components that may be utilized in a computing device/electronic device 702. The computing device/electronic device 702 may implement a utility meter 214, a controller 204, a display device 202, or a controlled device 206. Thus, although only one computing device/electronic device 702 is shown, the configurations herein may be implemented in a distributed system using many computer systems. Computing devices/electronic devices 702 may include the broad range of digital computers including microcontrollers, hand-held computers, personal computers, servers, mainframes, supercomputers, minicomputers, workstations, and any variation or related device thereof. Additionally, the computing device/electronic device 702 may be an embedded device inside an otherwise complete device, e.g., a utility meter 214, a controller 204, a display device 202, or a controlled device 206.

The computing device/electronic device 702 is shown with a processor 701 and memory 703. The processor 701 may control the operation of the computing device/electronic device 702 and may be embodied as a microprocessor, a microcontroller, a digital signal processor (DSP) or other device known in the art. The processor 701 typically performs logical and arithmetic operations based on program instructions stored within the memory 703. The instructions 704 in the memory 703 may be executable to implement the methods described herein.

The computing device/electronic device 702 may also include one or more communication interfaces 707 and/or network interfaces 713 for communicating with other electronic devices. The communication interface(s) 707 and the network interface(s) 713 may be based on wired communication technology, and/or wireless communication technology, such as ZigBee, WiMax, WiFi, Bluetooth, and/or cellular protocols, such as GSM, etc.

The computing device/electronic device 702 may also include one or more input devices 709 and one or more output devices 711. The input devices 709 and output devices 711 may facilitate user input/user output. Other components 715 may also be provided as part of the computing device/electronic device 702.

Data 706 and instructions 704 may be stored in the memory 703. The processor 701 may load and execute instructions 704*a* from the instructions 704 in memory 703 to implement various functions. Executing the instructions 704 may involve the use of the data 706 that is stored in the memory 703. The instructions 704 are executable to implement one or more of the processes or configurations shown herein, and the data 706 may include one or more of the various pieces of data described herein.

The memory 703 may be any electronic component capable of storing electronic information. The memory 703 may be embodied as random access memory (RAM), read only memory (ROM), magnetic disk storage media, optical storage media, flash memory devices in RAM, on-board memory included with the processor, EPROM memory, EEPROM memory, an ASIC (Application Specific Integrated Circuit), registers, and so forth, including combinations thereof.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The various illustrative logical blocks, modules and circuits described herein may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any conventional processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described herein may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. An exemplary storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Functions such as executing, processing, performing, running, determining, notifying, sending, receiving, storing, requesting, and/or other functions may include performing the function using a web service. Web services may include software systems designed to support interoperable machine-to-machine interaction over a computer network, such as the Internet. Web services may include various protocols and standards that may be used to exchange data between applications or systems. For example, the web services may include messaging specifications, security specifications, reliable messaging specifications, transaction specifications, metadata specifications, XML specifications, management specifications, and/or business process specifications. Commonly used specifications like SOAP, WSDL, XML, and/or other specifications may be used.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for presenting saving opportunities for electronic devices, the method comprising:

receiving, by a controller, experience based data learned from past power behavior of one or more devices;

generating one or more power saving opportunities based on the experience based data;

calculating estimated cost savings for the opportunities;

presenting a notification message to a user that describes the power saving opportunities and associated cost savings for the opportunities; and permitting a user to alter one or more of the power saving opportunities.

2. The method of claim 1, further comprising controlling one or more of the devices based on an opportunity chosen by the user.

3. The method of claim 1, further comprising:

gathering non-experience based data about present and future conditions that may affect power consumption or the cost of power consumption in the devices; and generating one or more power saving opportunities based on the experience based data and the non-experience based data.

4. The method of claim 3, wherein the non-experience based data is one or more of the following: a present price of power, an anticipated price of power, present weather conditions, anticipated weather conditions, user preferences in the devices, and available stored power.

5. The method of claim 1, wherein the experience based data is one or more of the following: power usage patterns, power consumption rates of the devices, and typical loads of the devices.

6. The method of claim 1, wherein the devices are one or more of the following: lighting devices, temperature control devices, security system devices, intercom system devices, audio devices, video devices, landscape devices, and control devices.

7. The method of claim 6, wherein the video devices are one or more of the following: Digital Versatile Disc (DVD) players, digital video recorders, videocassette recorders (VCRs), cable boxes, satellite receivers, and game consoles.

8. The method of claim 1, wherein one of the opportunities is a target electric bill for the devices.

9. The method of claim 1, wherein the cost savings is in units of currency.

10. The method of claim 1, wherein the cost savings is in units of greenhouse gas emissions.

11. A system that is configured to present saving opportunities for electronic devices, the system comprising:

a processor;

memory in electronic communication with the processor;

instructions stored in the memory, the instructions being executable to:

receive experience based data learned from past power behavior of one or more devices;

generate one or more power saving opportunities based on the experience based data;

calculate estimated cost savings for the opportunities;

present a notification message to a user that describes the power saving opportunities and associated cost savings for the opportunities; and permit a user to alter one or more of the power saving opportunities.

12. The system of claim 11, wherein the instructions are further executable to control one or more of the devices based on an opportunity chosen by the user.

13. The system of claim 11, wherein the instructions are further executable to:

gather non-experience based data about present and future conditions that may affect power consumption or the cost of power consumption in the devices; and generate one or more power saving opportunities based on the experience based data and the non-experience based data.

14. The system of claim 13, wherein the non-experience based data is one or more of the following: a present price of power, an anticipated price of power, present weather conditions, anticipated weather conditions, user preferences in the devices, and available stored power.

15. The system of claim 11, wherein the experience based data is one or more of the following: power usage patterns, power consumption rates of the devices, and typical loads of the devices.

16. The system of claim 11, wherein the devices are one or more of the following: lighting devices, temperature control devices, security system devices, intercom system devices, audio devices, video devices, landscape devices, and control devices.

17. The system of claim 16, wherein the video devices are one or more of the following: Digital Versatile Disc (DVD) players, digital video recorders, videocassette recorders (VCRs), cable boxes, satellite receivers, and game consoles.

18. The system of claim 11, wherein one of the opportunities is a target electric bill for the devices.

19. The system of claim 11, wherein the cost savings is in units of currency.

20. The system of claim 11, wherein the cost savings is in units of greenhouse gas emissions.

21. A computer-readable storage medium comprising executable instructions for:

receiving experience based data learned from past power behavior of one or more devices;

generating one or more power saving opportunities based on the experience based data;

calculating estimated cost savings for the opportunities;

presenting a notification message to a user that describes the power saving opportunities and associated cost savings for the opportunities; and permitting a user to alter one or more of the power saving opportunities.

22. The computer-readable medium of claim 21, further comprising instructions executable for controlling one or more of the devices based on an opportunity chosen by the user.

23. The computer-readable medium of claim 21, further comprising instructions executable for:

gathering non-experience based data about present and future conditions that may affect power consumption or the cost of power consumption in the devices; and generating one or more power saving opportunities based on the experience based data and the non-experience based data.

24. The computer-readable medium of claim 23, wherein the non-experience based data is one or more of the following: a present price of power, an anticipated price of power, present weather conditions, anticipated weather conditions, user preferences in the devices, and available stored power.

25. The computer-readable medium of claim 21, wherein the experience based data is one or more of the following: power usage patterns, power consumption rates of the devices, and typical loads of the devices.

26. The computer-readable medium of claim 21, wherein the devices are one or more of the following: lighting devices, temperature control devices, security system devices, intercom system devices, audio devices, video devices, landscape devices, and control devices.

27. The computer-readable medium of claim 26, wherein the video devices are one or more of the following: Digital Versatile Disc (DVD) players, digital video recorders, videocassette recorders (VCRs), cable boxes, satellite receivers, and game consoles.

28. The computer-readable medium of claim 21, wherein one of the opportunities is a target electric bill for the devices.

29. The computer-readable medium of claim 21, wherein the cost savings is in units of currency.

30. The computer-readable medium of claim 21, wherein the cost savings is in units of greenhouse gas emissions.

* * * * *

UNITED STATES PATENT AND TRADEMARK OFFICE

CERTIFICATE OF CORRECTION

PATENT NO. : 8,121,737 B2
APPLICATION NO. : 12/498932
DATED : February 21, 2012
INVENTOR(S) : William B. West et al.

It is certified that error appears in the above-identified patent and that said Letters Patent is hereby corrected as shown below:

On the title page item (54) and col. 1, line 3, replace “EDVICES” with --DEVICES--.

Signed and Sealed this
Twenty-sixth Day of June, 2012

David J. Kappos
*Director of the United States Patent and Trademark Office*